(12) United States Patent  
Mansfield et al.

(10) Patent No.: US 7,895,547 B2  
(45) Date of Patent: Feb. 22, 2011

(54) TEST PATTERN BASED PROCESS MODEL CALIBRATION

(75) Inventors: Scott M Mansfield, Hopewell Junction, NY (US); Geng Han, Fishkill, NY (US); Jason E Meiring, New Fairfield, CT (US); Dario Gil, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 12/113,374

(22) Filed: May 1, 2008

(65) Prior Publication Data

US 2009/0276736 A1     Nov. 5, 2009

(51) Int. Cl.
*G06F 17/50* (2006.01)

(52) U.S. Cl. .............................. 716/19; 716/20; 716/21; 703/14; 430/30

(58) Field of Classification Search ............. 716/19–21; 703/14; 430/30
See application file for complete search history.

(56) References Cited

U.S. PATENT DOCUMENTS

| | | | |
|---|---|---|---|
| 6,381,564 B1 | 4/2002 | Davis et al. | |
| 7,116,411 B2 | 10/2006 | Park et al. | |
| RE039,534 E | 3/2007 | Cooperberg et al. | |
| 2005/0273753 A1* | 12/2005 | Sezginer | 716/21 |
| 2006/0036345 A1* | 2/2006 | Cao et al. | 700/108 |
| 2006/0161452 A1* | 7/2006 | Hess | 705/1 |
| 2008/0044748 A1 | 2/2008 | Han et al. | |

\* cited by examiner

*Primary Examiner*—Naum B Levin  
(74) *Attorney, Agent, or Firm*—Yuanmin Cai (57) ABSTRACT

Embodiments of the present invention provide a method for performing lumped-process model calibration. The method includes creating a plurality of sub-process models for a set of sub-processes; creating a lumped-process-model incorporating said set of sub-processes; calculating a first set of output patterns from a set of test patterns by using said plurality of sub-process models; calculating a second set of output patterns from said set of test patterns by using said lumped-process-model; and adjusting process parameters used in said lumped-process-model to calculate said second set of output patterns to match said first set of output patterns. A computer system for performing the lumped-process model calibration is also provided.

17 Claims, 6 Drawing Sheets

TEST PATTERN BASED PROCESS MODEL CALIBRATION

FIELD OF THE INVENTION

The present invention relates to resolution enhancement techniques of photolithography in the field of semiconductor device manufacturing, and in particular relates to a calibration method for process models used in optical proximity correction.

BACKGROUND OF THE INVENTION

Manufacturing of semiconductor devices involves many patterning steps. Each of these patterning steps or patterning processes may in turn include several sub-steps or sub-processes. A typical patterning process may include, for example, creation of a photomask, use of the photomask in an optical exposure tool to expose a photosensitive material ("photoresist") applied on a wafer, development and rinse of the photoresist, and one or more etching steps to transfer patterns created in, and from, the photoresist to an underlying film or semiconductor substrate.

As is known in the art, some of these processes or sub-processes may have inherent nonlinearities and/or imperfections that need to be corrected. Such corrections may be accomplished by pre-distorting designs of patterns that are created in the photomask, through applying an industry standard methodology commonly known as Optical Proximity Correction (OPC), wherein one or more of the sub-processes are first characterized and/or modeled inside an OPC model or simulation package, and then the design of patterns for the semiconductor device is modified to account for the nonlinearity impact.

Accurately modeling of patterning processes is a critical and must-go-through step in any development of new semiconductor process technologies. So far, calibration of models used inside an OPC model or simulation package has proven to be a time consuming and resource intensive task. It is anticipated that reduction in this calibration cycle time shall lead to faster technology development and improve time-to-market deployment of next generation processes. On the other hand, long calibration cycle time may reduce the ability to quickly improve processes and/or incorporate improvements in unit process area into process-of-record (POR). For example, if a mask maker makes improvement in their mask making process and is ready to implement that process, they may need to wait until the next "OPC cycle" when models used inside OPC are updated and new photomasks are ordered. In other words, activities of the mask maker may need to be synchronized with the OPC cycle. Such OPC cycle could lead to, for example, a 6-month delay in the introduction of a newly improved process.

The reason that all unit processes are required to be synchronized with the so-called "OPC cycles" is due to the coupling of various processes used inside the OPC model. For instance, mask effects are generally not accounted for during OPC model build, and those mask effects typically get coupled with photoresist effects in the "resist model." Likewise, some optical effects may also be coupled into the resist model. The result of these coupling is that any changes to the mask, the optical, and/or the photoresist processes will require a complete rebuild of the resist model and possibly the optical model as well. This coupling effect and synchronizing of unit processes may ultimately cause longer time for the OPC cycle because, for each model rebuild, all the components inside the model must be rebuilt.

Figure 1:
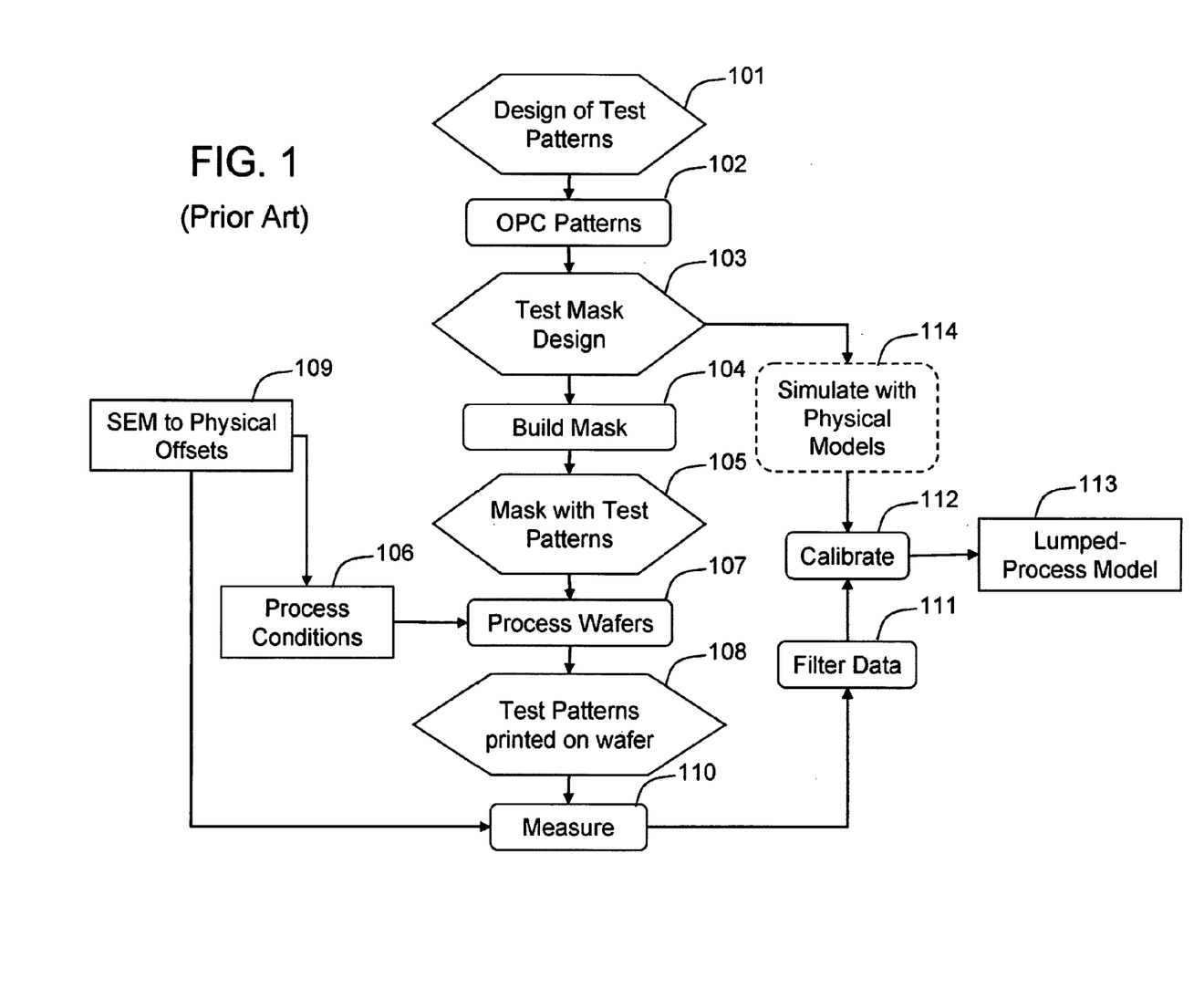
FIG. 1 is a flowchart illustration of a method, as is known in the art, for calibrating a lumped-process-model using measured wafer data.

FIG. 1 is a flowchart illustration of a method, as is known in the art, for calibrating a lumped-process-model using measured wafer data. The process typically starts with the design of test patterns (101). The test patterns are generally designed and/or selected such that they are able to cover the parameter space of interested images adequately. These test patterns are then made into OPC patterns (102) with the latest OPC keywords and assembled subsequently into a test mask design (103). Using test mask design 103, masks with test patterns (105) are then built or fabricated (104) using the latest mask manufacturing process.

Next, send-ahead-wafers are processed and a set of center process conditions (106) is determined. Wafers, or semiconductor wafers, for calibration are then processed (107) under the determined center process conditions and, possibly, other process conditions at variations to the center process conditions. The result is one or more fabricated semiconductor wafers (108) onto which images of test patterns (101) are transferred. The test patterns 101 printed on the wafers may capture, and/or bear characteristics of, the nonlinearities of the patterning process.

In the meantime, SEM-to-physical offsets may be pre-determined (109) for the patterning process and these offset values are used to help determine the center process conditions (106) and in measuring the calibration patterns. Subsequently, new SEM (scanning-electron-microscope) recipes are built based upon the latest test mask design and the results measured from fabricated wafers (110). The SEM data set may go through a filtering process (111) to remove bad measurement data. Finally, the filtered SET data set may be applied in the calibration (112) of a lumped-process-model (113).

In order to reduce cycle time of the above process, attempts have been made to skip some of the individual steps whenever possible. For example, if the SEM-to-physical offset values are already known for a given process and/or a given SEM tool, then that step (109) may be skipped. However, skipping a couple of individual steps will rarely reduce more than a few weeks off of the overall cycle time, which may span over, for example, a 6-month time period depending on various factors. Meanwhile, many of the more time consuming steps such as, for example, processing the wafers (107) and collecting data by measuring the processed wafers (110), may not be skipped and may not be performed in parallel.

Figure 2:
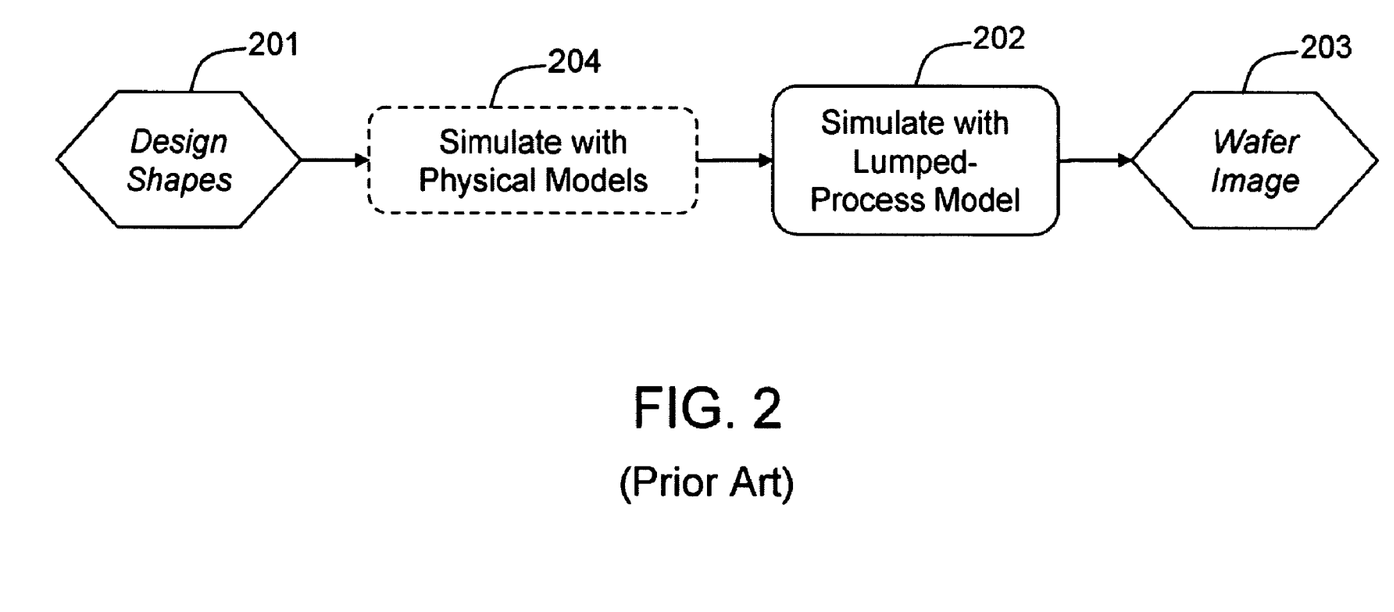
FIG. 2 is a flowchart illustration of a wafer image simulation flow, as is known in the art, using the lumped-process-model calibrated in FIG. 1.

FIG. 2 is a flowchart illustration of a wafer image simulation flow, as is known in the art, using a lumped-process-model. As is known in the art, after the lumped process model (113) is properly calibrated as being illustrated in FIG. 1, shapes (201) designed for a particular semiconductor device or device interconnect may be directly simulated using the calibrated lumped-process-model (202) to give prediction of expected wafer images (203), which may be pre-distorted wafer image as described above. Theoretically, to the extent that the lumped-process-model accurately represents the process, the wafer images may include all of the nonlinearities of the patterning process that is being modeled.

Still, lumped-process-models using the above process modeling lacks proper predictive accuracy. For example, when using an OPC model to predict the behavior or characteristics of a process under certain expected process variations and/or nominal changes in process conditions, the model may suffer from having too many processes being coupled together in an empirical "resist model". On the other hand, if each process was to be modeled independently with physically based models, variations in those processes may be properly accounted for. However, in order to do so, physical model forms and improved calibration methodologies are needed but these physical models are generally too slow to provide useful simulations on real semiconductor layouts.

In order to improve predictive accuracy of the lumped-process-model, attempts were also made to separate out one or more sub-processes that may be modeled physically and have the lumped-process-model describing only the non-physically-modeled effects. For example, in photolithography, a large portion of the overall patterning nonlinearity comes from the optical exposure step and this step may be modeled in relative accuracy with physical models. In this situation, it may be more appropriate to simulate the optical exposure step in physical models, and capture only the photomask and photo-resist related nonlinearities in a single lumped-process-model. The method used to calibrate such a hybrid model is illustrated in FIG. 1 at step 114. Specifically, physical models (114) may be used to simulate the test patterns associated with the optical exposure, the results of which may then be provided in the following calibration step (112) to calibrate the lumped-process-model (113). In this modified approach, the lumped-process-model 113 approximately represents the nonlinearities of all of the non-physically-modeled sub-processes. However, this approach still couples several effects together in a non-physical manner which does not allow a sub-process to be replaced with a new process without the significant loss of accuracy. In order to maintain good accuracy, a complete recalibration of the lumped-process-model is required whenever one of the sub-processes, including those that have physical models, is changed.

When utilizing the above hybrid, physical/lumped-process-model approach, simulation flow may be modified accordingly as being illustrated in FIG. 2. For example, test patterns (201) may be first simulated with the physical models (204). Results from the physical models (204) may then be fed as input to the simulation using the lumped process model (202) to create wafer image (203).

BRIEF DESCRIPTION OF THE DRAWINGS

The present invention will be understood and appreciated more fully from the following detailed description of the invention, taken in conjunction with the accompanying drawings of which.

It will be appreciated that for simplicity and clarity of illustration, elements shown in the drawings have not necessarily been drawn to scale. For example, the dimensions of some of the elements may be exaggerated relative to other elements for clarity.

SUMMARY OF THE INVENTION

Embodiments of the present invention provide a method for calibrating an OPC model, which may be a "lumped-process-model". Embodiments of the method include creating a plurality of sub-process models for a set of sub-processes; creating a lumped-process-model incorporating the set of sub-processes; calculating a first set of output patterns from a set of test patterns by using the plurality of sub-process models; calculating a second set of output patterns from the set of test patterns by using the lumped-process-model; and adjusting process parameters used in the lumped-process-model to calculate the second set of output patterns to match the first set of output patterns.

According to one embodiment, calculating the first set of output patterns includes applying a first sub-process model of the plurality of sub-process models to the set of test patterns to generate a first set of simulated test patterns, the first sub-process model corresponds to a first sub-process in a process flow; applying a second sub-process model of the plurality of sub-process models to the first set of simulated test patterns to generate a second set of simulated test patterns, the second sub-process model corresponds to a second sub-process in the process flow; continuing applying a subsequent sub-process model of the plurality of sub-process models to simulated test patterns generated from a preceding sub-process model to generate new simulated test patterns; and obtaining the first set of output patterns as a set of simulated test patterns generated by a last sub-process model of the plurality of sub-process models in the process flow.

According to another embodiment, calculating the second set of output patterns includes applying the set of test patterns to at least one physical model to produce an intermediate set of output patterns; applying the intermediate set of output patterns to the lumped-process-model to calculate the second set of output patterns.

According to yet another embodiment, the sub-process models are unit-process models, the unit-process models being created when new unit processes are introduced in a patterning process.

According to a further embodiment, creating the lumped-process model include applying the plurality of sub-process models to the set of sub-processes and obtaining simulated sub-process results; and building the lumped-process model based on aggregation of the simulated sub-process results.

Embodiments of the method may also include calibrating the sub-process models such that the sub-process models being individually tuned to their respective sub-processes. The sub-process models are constructed under constraints such that they being independent from each other and being separable from each other. According to one embodiment, the sub-process models are adapted to predict certain behaviors or characteristics of corresponding sub-processes with relatively good accuracy.

DETAILED DESCRIPTION OF THE INVENTION

Embodiments of the present invention provide a method for calibrating an OPC process model, which may be known as a "lumped-process-model" (LPM). The calibration method may significantly reduce cycle time in making incremental changes to existing unit processes, while improving predictive accuracies and capabilities of the process model.

According to one embodiment of the present invention, individual processes may be modeled in individual, separable "unit-process-models" (UPM) and these UPM models may be created whenever a new unit process is developed. After a unit process changes, including those that are modeled with a physical model, a lumped-process-model that accounts for all unit processes may be created and/or updated.

According to embodiment of the present invention, the creation and/or updating of this lumped-process-model may be carried out very rapidly. Whereas prior art methodologies require that wafers be processed and an entire calibration data set be measured to create or update the lumped-process-model, embodiments of the present invention enable the use of a significantly smaller set of data being collected. For example, if the process that changes uses an empirical unit-process-model, then the calibration of the unit-process-model may be carried out with a reduced data set that may be tailored for the specific unit process. On the other hand, if the unit process that changes is one that is modeled with a physical model, then no data collection may be needed.

For example, a full calibration set of a prior art methodology may require that SEM measurements of, for example, 1000 or more patterns be taken at multiple locations on multiple wafers. This can cause over 10,000 total measurements which may require more than 20 hours of raw measurement time and at least the same amount of time in cleaning and verifying the integrity of the data collected. On the other hand, a model that only requires capturing the effects of the photoresist may achieve sufficient accuracy based on 10-100 scatterometry measurements, which may be completed in a couple hours and may require essentially no cleaning and verifying.

Embodiments of methods according to the present invention may create a lumped-process-model through a calibration methodology that involves simulating each unit process during the patterning process, and then building the lumped-process-model to the aggregated results of each of the unit process simulations. Once unit-process-models become available for each unit process included in the lumped-process-model, the full set of calibration patterns may be simulated using each of the unit-process-models. The results of simulations are then used in a calibration procedure that may be equivalent to the calibration procedure known in the art, except that the normal measured data used in the calibration is replaced by the output results of the unit process simulations.

According to embodiments of the present invention, simulation of the full set of calibration patterns may typically be accomplished in less than, for example, one hour depending on the CPU power, and the results generally require no cleaning and verifying. The total amount of time required to create a new lumped-process-model when a single unit process step changes may be reduced down to less than 4 hours as being compared to the prior art methodology that could take more than two full days, assuming the same CPU power used in the simulation.

In addition to reduction in cycle time, a lumped-process-model created according to embodiments of the present invention may provide more predictive accuracy than those of prior art methodologies. For example, since one of the primary process changes in a photolithography patterning process is the optical exposure step and this step may be modeled relatively accurately with a physical model, this new methodology of test pattern based process model calibration, according to embodiments of the present invention, may be used to create lumped-process-models for processes that may not even exist yet. When creating a predictive lumped-process-model, the physical model may be changed to the desired process and the separable unit-process-models for all other sub-processes may be left unchanged or the same. In comparison, prior art methodologies require real wafer data from the process modeled in order to create the lumped-process-model, which causes the predictive capabilities of those models being very limited.

Figure 3:
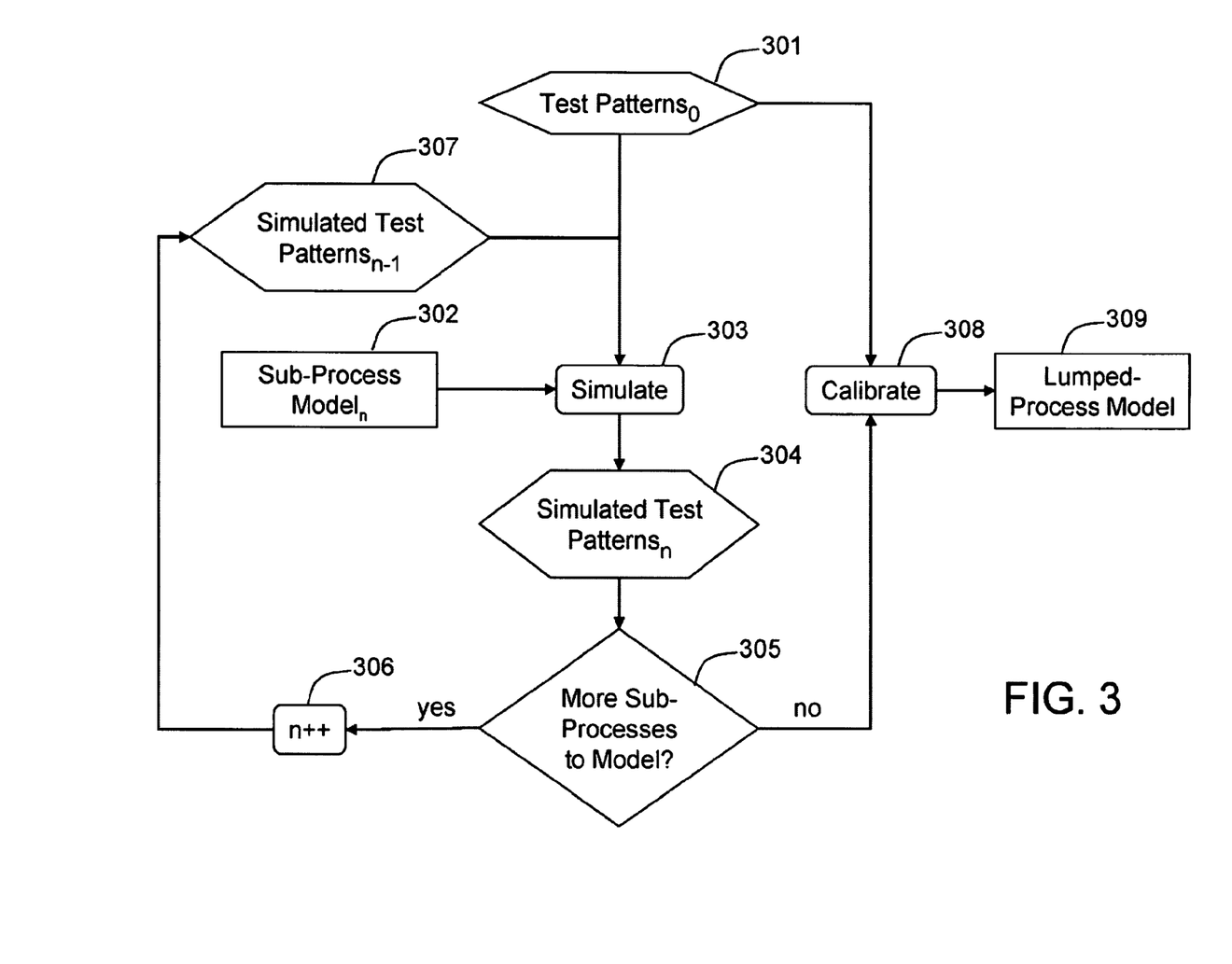
FIG. 3 is a simplified flowchart illustration of a calibration method for a lumped-process-model using simulated wafer data according to one embodiment of the present invention.

FIG. 3 is a simplified flowchart illustration of a calibration method for a lumped-process-model using simulated wafer data according to one embodiment of the present invention. Specifically, FIG. 3 illustrates a lumped-process-model (LPM) calibration flow where multiple, individual process models are used to calibrate a single LPM. In a typical semiconductor process, mask, optical, and photo-resist effects may be lumped together into a single LPM. The first step in this process of creating the LPM is the creation of individual sub-process models (SPM) for each of the processes that are to be contained in the lumped-process-model. The calibration of each of the individual sub-process models may be achieved through industry standard or proprietary methodologies.

According to one embodiment of the present invention, these sub-process models (SPM) may be unit-process models (UPM) constructed under constraints such that they may describe a single process in relatively good accuracy which does not depend on the processes that either precede or follow the one being described. This property may be referred to hereinafter as "separability." According to one embodiment of the present invention, each individual sub-process models (or unit-process models) so constructed may also possess a property of "predictability" where they may be able to predict, relative accurately, behaviors or characteristics under conditions that may differ from those where the lumped-process-model was calibrated. However, a person skilled in the art will appreciate that the present invention is not limited in this respect. Even though predictability is a desirable property for the individual sub-process models, it is not necessary according to some embodiments of the present invention.

According to one embodiment, a new sub-process model (SPM) shall be created when a new sub-process is developed. This is based on the notion that creation of a single sub-process model may be achieved significantly more efficiently than the creation of a full lumped-process-model using methods known in the art, as the one being illustrated in FIG. 1. The efficiency comes from the fact that methods for calibrating the individual SPM model may be highly tuned to the specific sub-process being modeled.

Once individual and separable sub-process models (SPM) have been made available for all sub-processes that are going to be included in the lumped-process-model, a set of calibration test patterns may be simulated with each of the sub-process models. The simulation typically starts with the shapes of test patterns that enter the first sub-process being modeled and then proceeds in an order that follows the process flow. More specifically, as being illustrated in FIG. 3, test patterns (301) may initially be used as input to sub-process model (302, n=0) and simulated at block (303). Simulation (303) may use input of test patterns (301) and create simulated test patterns (304, n=0). After simulation using the input test patterns (301), at block (305), it is determined whether there is more sub-processes to be modeled.

If it is determined that there is more sub-process to be modeled, the simulation then moves (306) onto the next sub-process (n=1). In simulating sub-process (n=1) at block 303 by applying sub-process model (302, n=1), the simulated test patterns obtained from the preceding sub-process model (307) may be used as input. This as a result produces simulated test patterns (304, n=1), which may in turn be used as input to the next sub-process model (302, n=2). Similarly in the next step, it is determined that whether there is more sub-process to be modeled, and the entire simulation process as described above may be repeated. This process of applying simulated test patterns (307) from a preceding process (304, n) in the simulation (303) of a next sub-process model (302, n+1) may continue until a final sub-process model contained in the lumped-process-model is reached and its simulation is performed.

For example, if a lumped-process-model is created that includes the effects of mask making, optical exposure and photoresist development, then the simulation may start with the mask design for the test patterns. The mask design is then simulated (303) using a mask model (302, n=0), with test patterns (301) as input, to create shapes that represent the mask pattern (304, n=0). The mask patterns are then used as input (307, n=0) to an optical simulation model (302, n=1) which creates shapes that represent the optical image inside the photoresist (304, n=1). Finally, a photoresist model (302, n=2) transforms the optical image (307, n=1) into shapes that represent the developed photoresist pattern (304, n=2).

Once all the sub-processes have been modeled, as being determined at block 305, the lumped-process-model (309) may be calibrated to find model parameters that will describe the transformation from the initial input, namely test patterns (301), to the final simulated output of this series of simulation steps. According to embodiments of the present invention, data used in a typical calibration process (308), also known as an optimization process, is now taken from the final simulated output (final simulated output from block 304), rather than direct measurement data as in the prior art.

Performing above calibration typically involves building multiple test lumped-parameter-models and using those models and the initial input shapes to simulate output image shapes. The simulated output using each test model is compared to the "measurement data", which is the final simulated output from block 304, and as a result an error metric may be computed. Based upon the error computed, an algorithm, which may be known as an optimization algorithm, may be used to find the better and ideally optimum model parameters (process parameters) that may reduce and ideally minimize the error metric and, thus, create an improved and ideally optimum lumped-process-model (309). In other words, a set of adjusted (ideally optimal) model parameters may be found for the lumped-process-model that may reduce and ideally minimize the error between the simulation using the lumped-process-model and the simulation using multiple, separable sub-process models, according to embodiments of the present invention.

According to another embodiment of the present invention, a lumped-process-model (LPM) may be used in conjunction with a physical model, where a physical model is one based on parameters that may be measured directly and generally do not require calibration. Similarly, the lumped-process model may be calibrated against final simulated test patterns obtained using multiple, separate sub-process models as described above. According to one embodiment, processes that occur either prior to or after the one that has a physical model may be lumped together, creating a "sub lumped-process-model", and the sub lumped-process-model (sub-LMP) may be combined with the physical model to create the lumped-process-model. According to certain embodiments of the present invention, a combination of the physical model and sub lumped-process-model may be used to simulate, in relative good approximation, nonlinearities of the patterning process. An example of this is when a physical optical model is used with an empirical process model, or a sub process model. In this case, the sub process model may capture both the effects of nonlinearities in the photomask making process which occurs prior to the optical exposure and the photoresist exposure/development process which occurs after the optical exposure.

Figure 4:
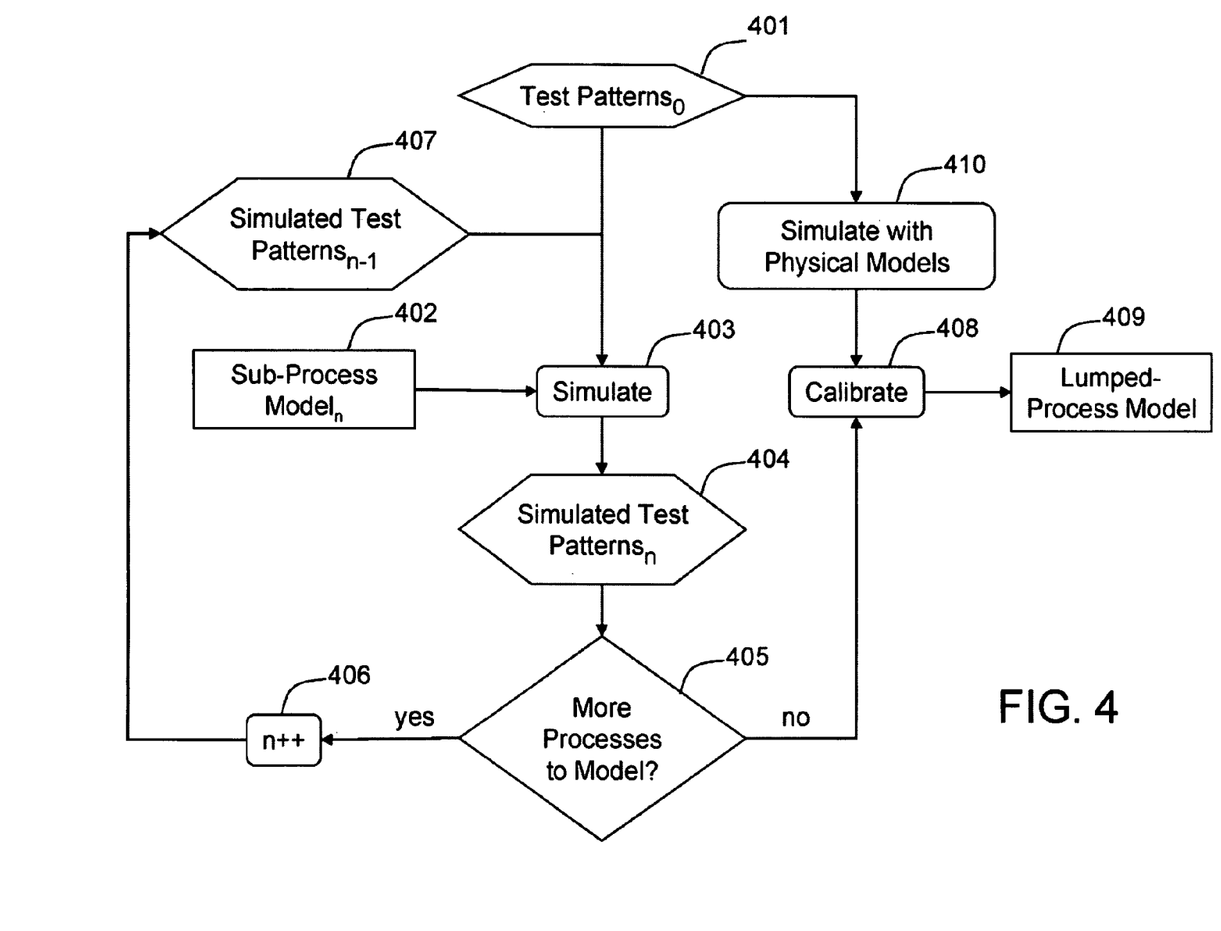
FIG. 4 is a simplified flowchart illustration of a calibration method for a lumped-process-model that incorporates physical models for one or more sub-processes and uses simulated wafer data according to another embodiment of the present invention.

FIG. 4 is a simplified flowchart illustration of a calibration method for a lumped-process-model that incorporates a physical model for one or more sub-processes and uses simulated wafer data according to another embodiment of the present invention. Similar to the embodiments as illustrated in FIG. 3, embodiments of the calibration method may include using initial test patterns (401) and a first sub-process model (402) to obtain simulated test patterns (404) in a simulation (403), and subsequently (406) using simulated test patterns (407) of a preceding sub-process as input parameters to simulate (403) a subsequent sub-process in a next sub-process model (402). This chain of simulation continues until simulation for the last sub-process is performed (405).

FIG. 4 further illustrates that embodiments of the method may include performing simulation using physical model or models (410) on test patterns (401), and applying results from the physical model simulation in calibrating (408) the lumped-process-model (409). In other words, output of the physical model simulation, which may be referred to hereinafter as intermediate output, may be used in parameter calibration step 408 together with any "measurement data" taken from the final simulated output (404) using sub-process models. That way, the sub-process models may primarily capture the effects of other non-physically modeled sub-processes.

The above described embodiments of present invention have primarily focused on the patterning sub-processes of mask making, optical exposure, and photoresist exposure/development. It is understood that other sub-processes including three-dimensional mask effects (so-called "electro-magnetic-field" or EMF effects), various thin-film processing techniques, such as etching and deposition, and the metrology process could also be modeled according to above embodiments. Depending upon the process used and the models available, these sub-processes may be modeled using physical models or have their effects included in the sub-process model.

Figure 5:
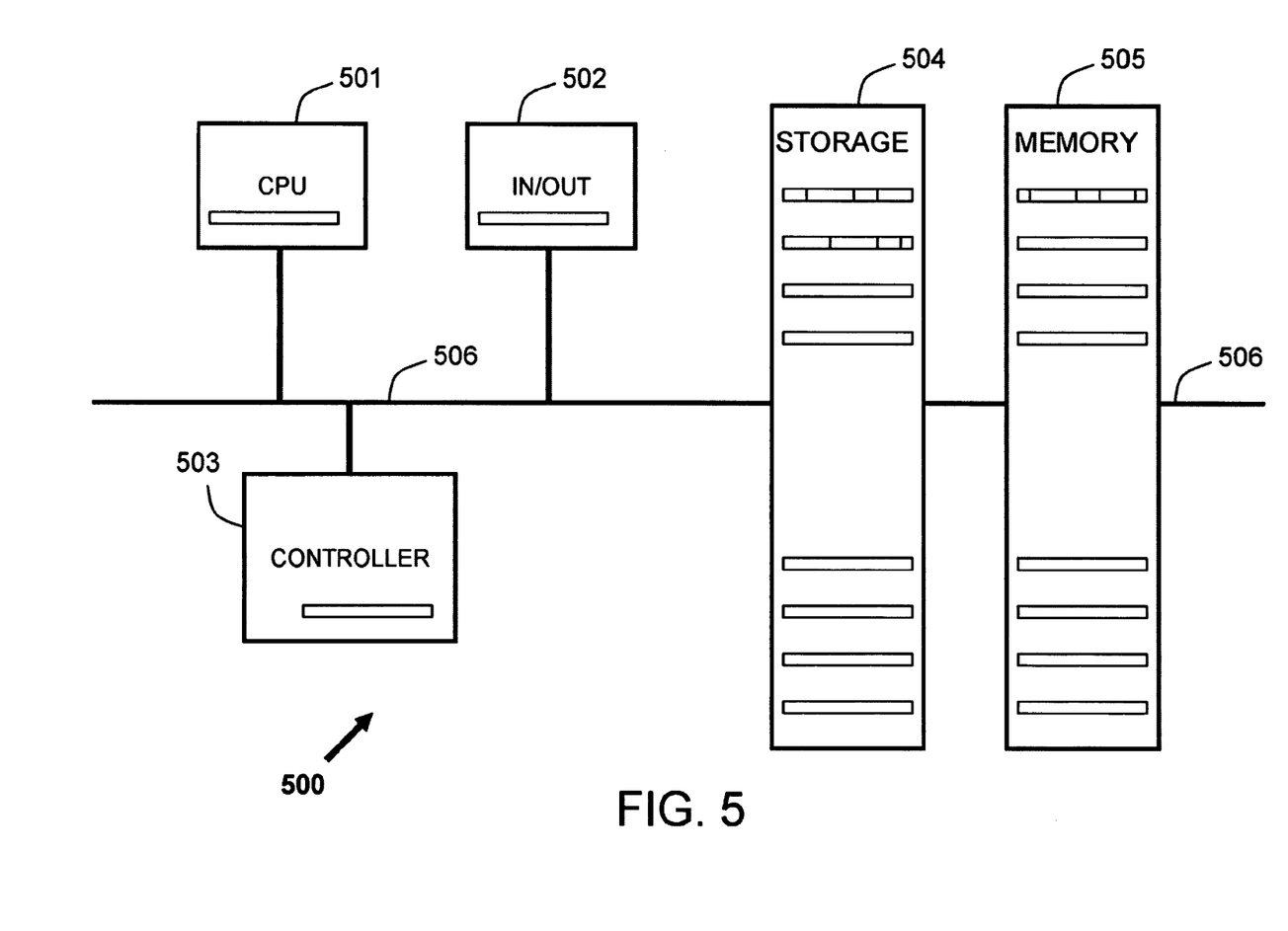
FIG. 5 is a demonstrative illustration of a computing system adapted to perform lumped-process-model calibration according to embodiment of the present invention.

Methods of performing process model calibration as described above, according to embodiments of the present invention, may be implemented in a machine, a computer, or a computing system. For example, FIG. 5 is a simplified diagram illustration of a computer or computing system 500 according to one embodiment of the present invention. Computer or computing system 500 may include, inter alia, a central processing unit (CPU) 501 for data processing; one or more input/output (I/O) devices 502 such as, for example, a keyboard, a mouse, a compact disk (CD) drive, a display device, or a combination thereof or the like for accepting instructions and/or input from an operator or user and for outputting results from CPU 501 that processes data during simulation or computation; a controller 503 capable of controlling operation of computing system 500; one or more storage devices or media 504 capable of reading and/or writing computer readable code; and a memory device or medium 505—all of which are operationally connected, for example, via a bus or a wired or wireless communications network (506). Further more, embodiments of the present invention may be implemented as a computer program product stored on a computer readable medium such as, for example, storage device 504 or memory device 505. The computer program product or machine-readable medium may contain instructions which, when being executed, may implement embodiments of the method according to present invention on computing system 500. Finally, the present invention can also be implemented in a plurality of distributed computers where the present items may reside in close physical proximity or distributed over a large geographic region and connected by a communications network.

Figure 6:
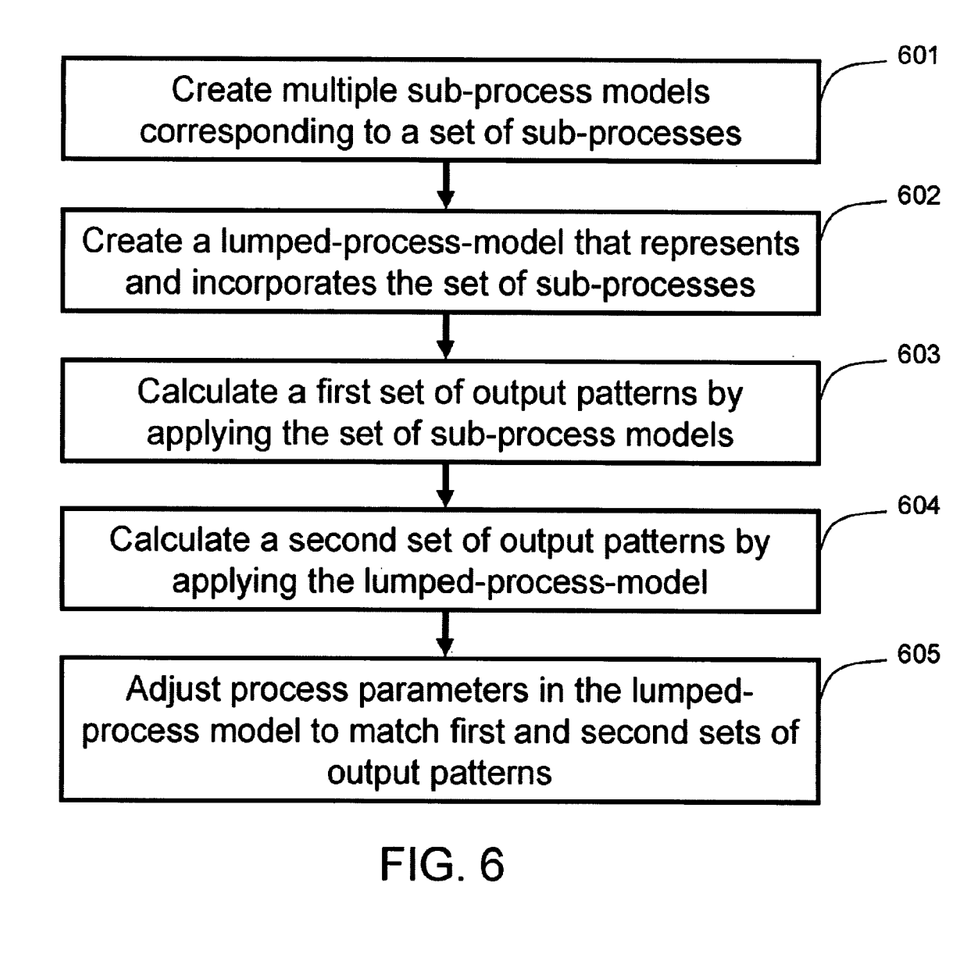
FIG. 6 is a simplified flowchart illustration of a method of performing process model calibration according to embodiments of the present invention.

FIG. 6 is a simplified flowchart illustration of a method of performing process model calibration according to embodiments of the present invention. For example, embodiments of the method may include steps of creating multiple sub-process models corresponding to a set of sub-processes (601); creating a lumped-process-model that represents and incorporates the same set of sub-processes (602); calculating a first set of output or output images (or patterns) from a set of test patterns by using the multiple sub-process models (603); calculating a second set of output or output images (or patterns) from the same set of test patterns by using the lumped-process-model (604); and subsequently adjusting process parameters (605) that are used in the lumped-process-model such that the second set of output or output patterns matches with those of the first set of output or output patterns produced by the multiple sub-process models.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method for performing a process model calibration, the method comprising:
   using a computer for:
   calibrating a plurality of sub-process models for a set of sub-processes;
   creating a lumped-process-model incorporating said set of sub-processes;
   calculating a first set of output patterns from a set of test patterns by using said plurality of sub-process models, wherein calculating said first set of output patterns comprises:
      applying a first sub-process model of said plurality of sub-process models to said set of test patterns to generate a first set of simulated test patterns, said first sub-process model corresponds to a first sub-process in a process flow;
      applying a second sub-process model of said plurality of sub-process models to said first set of simulated test patterns to generate a second set of simulated test patterns, said second sub-process model corresponds to a second sub-process in said process flow;
      continuing applying a subsequent sub-process model of said plurality of sub-process models to simulated test patterns generated from a preceding sub-process model to generate new simulated test patterns; and
      obtaining said first set of output patterns as a set of simulated test patterns generated by a last sub-process model of said plurality of sub-process models in said process flow;
   calculating a second set of output patterns from said set of test patterns by using said lumped-process-model; and
   calibrating said lumped-process-model to match said second set of output patterns with said first set of output patterns.

2. The method of claim 1, wherein calculating said second set of output patterns comprises:
   applying said set of test patterns to at least one physical model to produce an intermediate set of output patterns;
   applying said intermediate set of output patterns to said lumped-process-model to calculate said second set of output patterns.

3. The method of claim 1, wherein said sub-process models are unit-process models, said unit-process models being created when new unit processes are introduced in a patterning process.

4. The method of claim 3, further comprising calibrating said sub-process models such that said sub-process models being individually tuned to their respective sub-processes.

5. The method of claim 3, wherein said sub-process models are constructed under constraints such that they being independent from each other and being separable from each other.

6. The method of claim 3, wherein said sub-process models are adapted to predict characteristics of corresponding sub-processes with relatively good accuracy.

7. The method of claim 1, wherein creating said lumped-process model comprises:
   applying said plurality of sub-process models to said set of sub-processes and obtaining simulated sub-process results; and
   building said lumped-process model based on aggregation of said simulated sub-process results.

8. The method of claim 7, wherein calibrating said lumped-process-model comprises computing an error metric based upon difference between said first and second set of output patterns, and finding a set of values of process parameters used in said lumped-process-model that produces reduced value of said error metric.

9. A system for performing process model calibration, the system comprising:
   at least one storage device to store machine-readable codes;
   a central processing unit (CPU) operationally connected to the storage device; and
   a controller controlling the storage device and the CPU, wherein the CPU is adapted to execute the machine-readable codes to:
   create a plurality of sub-process models for a set of sub-processes;
   create a lumped-process-model incorporating said set of sub-processes;
   calculate a first set of output patterns from a set of test patterns by using said plurality of sub-process models, wherein calculate said first set of output patterns comprises:
      apply a first sub-process model of said plurality of sub-process models to said set of test patterns to generate a first set of simulated test patterns, said first sub-process model corresponds to a first sub-process in a process flow;
      apply a second sub-process model of said plurality of sub-process models to said first set of simulated test patterns to generate a second set of simulated test patterns, said second sub-process model corresponds to a second sub-process in said process flow;
      continue applying a subsequent sub-process model of said plurality of sub-process models to simulated test patterns generated from a preceding sub-process model to generate new simulated test patterns; and
      obtain said first set of output patterns as a set of simulated test patterns generated by a last sub-process model of said plurality of sub-process models in said process flow;
   calculate a second set of output patterns from said set of test patterns by using said lumped-process-model; and adjust process parameters used in said lumped-process-model to calculate said second set of output patterns to match said first set of output patterns.

10. The system of claim 9, further comprising at least one input/output device, said input/output device is adapted to accepting instructions and input from an operator and for outputting results from CPU executing the machine-readable medium during simulation.

11. The system of claim 9, wherein calculating said second set of output patterns comprises:
applying said set of test patterns to at least one physical model to produce an intermediate set of output patterns;
applying said intermediate set of output patterns to said lumped-process-model to calculate said second set of output patterns.

12. The system of claim 9, wherein said sub-process models are unit-process models, said unit-process models being created when new unit processes are introduced in a patterning process.

13. The system of claim 12, further comprising calibrating said sub-process models such that said sub-process models being individually tuned to their respective sub-processes.

14. The system of claim 12, wherein said sub-process models are constructed under constraints such that they being independent from each other and being separable from each other.

15. A machine-readable storage device having stored thereon a set of instructions that, when executed by a machine, result in:
create a plurality of sub-process models for a set of sub-processes;
create a lumped-process-model incorporating said set of sub-processes;
calculate a first set of output patterns from a set of test patterns by using said plurality of sub-process models, wherein calculate said first set of output patterns comprises:
apply a first sub-process model of said plurality of sub-process models to said set of test patterns to generate a first set of simulated test patterns, said first sub-process model corresponds to a first sub-process in a process flow;
apply a second sub-process model of said plurality of sub-process models to said first set of simulated test patterns to generate a second set of simulated test patterns, said second sub-process model corresponds to a second sub-process in said process flow;
continue applying a subsequent sub-process model of said plurality of sub-process models to simulated test patterns generated from a preceding sub-process model to generate new simulated test patterns; and
obtain said first set of output patterns as a set of simulated test patterns generated by a last sub-process model of said plurality of sub-process models in said process flow;
calculate a second set of output patterns from said set of test patterns by using said lumped-process-model; and
adjust process parameters used in said lumped-process-model to calculate said second set of output patterns to match said first set of output patterns.

16. The machine-readable storage device of claim 15, wherein calculating said second set of output patterns comprises:
applying said set of test patterns to at least one physical model to produce an intermediate set of output patterns;
applying said intermediate set of output patterns to said lumped-process-model to calculate said second set of output patterns.

17. The machine-readable storage device of claim 15, wherein said sub-process models are unit-process models, said unit-process models being created when new unit processes are introduced in a patterning process, further comprising calibrating said sub-process models such that said sub-process models being individually tuned to their respective sub-processes.

* * * * *